(12) United States Patent
Fujino et al.

(10) Patent No.: US 10,956,092 B2
(45) Date of Patent: Mar. 23, 2021

(54) SEMICONDUCTOR STORAGE DEVICE

(71) Applicant: KIOXIA CORPORATION, Tokyo (JP)

(72) Inventors: Yorinobu Fujino, Kanagawa (JP); Kosuke Hatsuda, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/802,454

(22) Filed: Feb. 26, 2020

(65) Prior Publication Data

US 2020/0364002 A1 Nov. 19, 2020

(30) Foreign Application Priority Data

May 15, 2019 (JP) .............................. JP2019-092236

(51) Int. Cl.
| | |
|---|---|
| *G11C 7/00* | (2006.01) |
| *G06F 3/06* | (2006.01) |
| *G11C 8/14* | (2006.01) |
| *G11C 8/10* | (2006.01) |
| *G11C 17/18* | (2006.01) |

(52) U.S. Cl.
CPC .............. *G06F 3/0688* (2013.01); *G11C 8/10* (2013.01); *G11C 8/14* (2013.01); *G11C 17/18* (2013.01)

(58) Field of Classification Search
CPC .......... G06F 3/0688; G11C 8/10; G11C 8/14; G11C 17/18

USPC ...................................................... 365/189.11
See application file for complete search history.

(56) References Cited

U.S. PATENT DOCUMENTS

2010/0188891 A1* 7/2010 Taniguchi .......... G11C 14/0081
                                                              365/158
2018/0277187 A1 9/2018 Ikegami et al.

FOREIGN PATENT DOCUMENTS

JP          2018-156556 A      10/2018

* cited by examiner

*Primary Examiner* — Harry W Byrne
(74) *Attorney, Agent, or Firm* — Kim & Stewart LLP

(57) ABSTRACT

A semiconductor storage device comprises first and second memory cells each including a variable-resistance element, a write driver, and a control circuit that concurrently performs an operation to read first data in the first memory cell and second data in the second memory cell, the operation to read the first data including a first write operation for a first time length and the operation to read the second data including a second write operation for a second time length. In the first write operation, the write driver applies, to the first memory cell, a first voltage for a third time length and a second voltage different from the first voltage for a fourth time length. In the second write operation, the write driver applies the first voltage to the second memory cell for a fifth time length longer than the third time length and longer than the fourth time length.

20 Claims, 8 Drawing Sheets

SEMICONDUCTOR STORAGE DEVICE

CROSS-REFERENCE TO RELATED APPLICATION

This application is based upon and claims the benefit of priority from Japanese Patent Application No. 2019-092236, filed May 15, 2019, the entire contents of which are incorporated herein by reference.

FIELD

Embodiments described herein relate generally to a semiconductor storage device.

BACKGROUND

A semiconductor storage device including a variable-resistance element is known.

Examples of related art include JP-A-2018-156556.

DETAILED DESCRIPTION

The present disclosure relates to improving operational reliability.

In general, according to one embodiment, a semiconductor storage device includes first and second memory cells each including a variable-resistance element, a write driver configured to apply a voltage to each of the first and second memory cells, and a control circuit configured to concurrently perform an operation to read first data in the first memory cell and second data in the second memory cell, the operation to read the first data in the first memory cell including a first write operation for a first time length and the operation to read the second data in the second memory cell including a second write operation for a second time length. In the first write operation, the write driver applies, to the first memory cell, a first voltage for a third time length and a second voltage different from the first voltage for a fourth time length. In the second write operation, the write driver applies the first voltage to the second memory cell for a fifth time length longer than the third time length and longer than the fourth time length.

Hereinafter, embodiments will be described with reference to the drawings. Each embodiment is an example of a device or a method for embodying a technical idea of the present disclosure. The drawings are schematic or conceptual, and the dimensions and ratios of the drawings are not necessarily the same as those in actual ones. The technical idea is not limited by a shape, a structure, an arrangement or the like of elements described herein.

In the following description, elements having substantially same functions and configurations are denoted by the same reference sign. The numbers after the reference sign are used to distinguish elements having substantially same functions and configurations. When it is not necessary to distinguish the elements having substantially same functions and configurations, each of these elements is referenced by the same reference sign.

Embodiment

Hereinafter, a semiconductor storage device 1 according to the embodiment will be described.

[1] Configuration of Semiconductor Storage Device 1

[1-1] Overall Configuration of Memory System MS Including Semiconductor Storage Device 1

Figure 1:
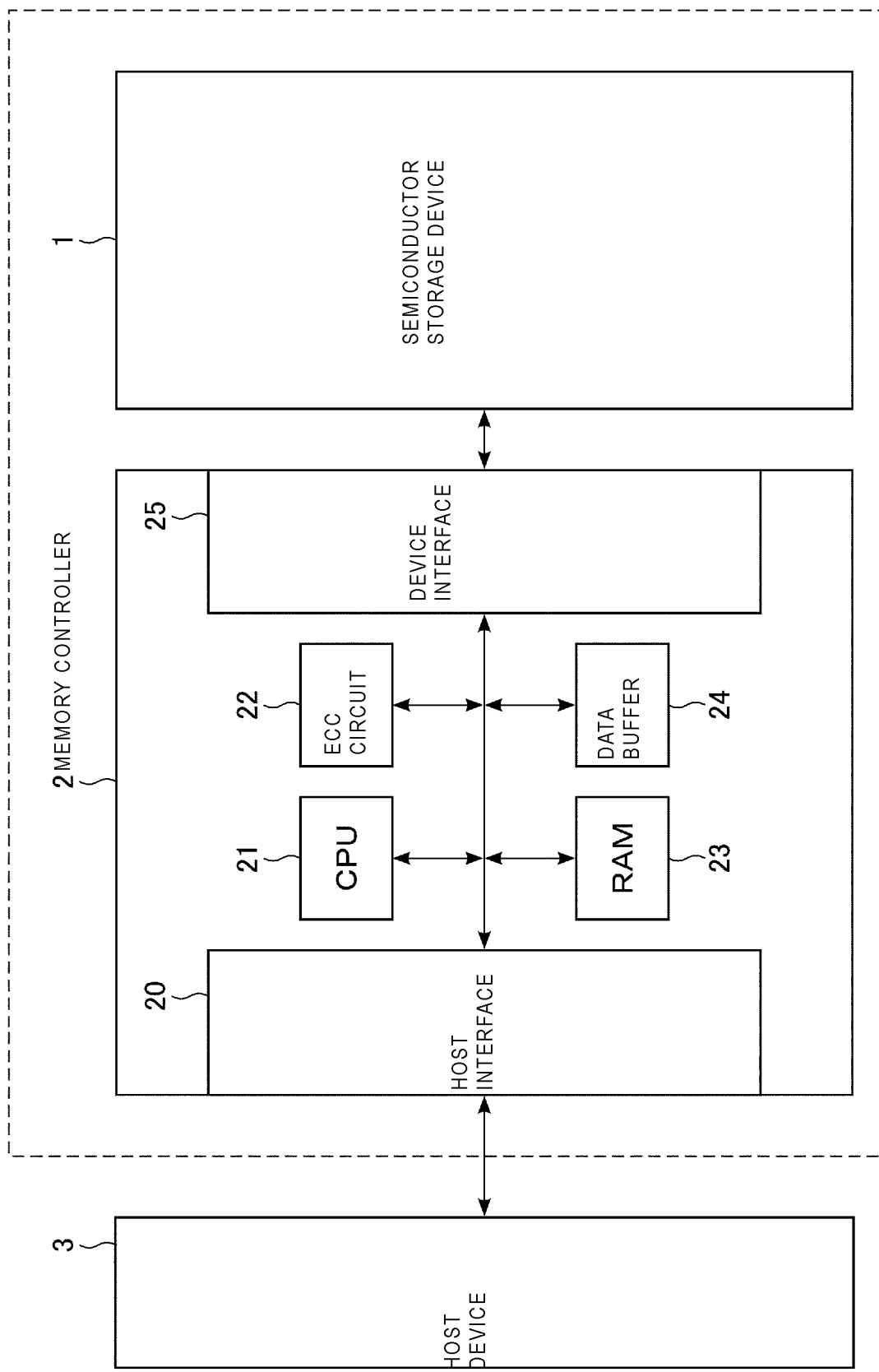
FIG. 1 is a block diagram showing a configuration example of a memory system including a semiconductor storage device according to an embodiment.

FIG. 1 shows a configuration example of a memory system MS including the semiconductor storage device 1 according to the embodiment. As shown in FIG. 1, the memory system MS includes the semiconductor storage device 1 and a memory controller 2. The memory system MS is connected to an external host device 3 and performs various operations in accordance with a command from the host device 3.

The semiconductor storage device 1 uses a variable-resistance element as a memory cell and stores data in a nonvolatile manner. As the variable-resistance element, for example, an element having a magnetoresistive effect occurring in a magnetic tunnel junction (MTJ) is used. The element having the magnetoresistive effect is called, for example, an MTJ element or a magnetoresistive effect element. A detailed configuration of the semiconductor storage device 1 will be described later.

The memory controller 2 is, for example, a system on chip (SoC), and commands the semiconductor storage device 1 to read data, write data in response to the command from the host device 3. In addition, the memory controller 2 includes a host interface 20, a central processing unit (CPU) 21, an error correction code (ECC) circuit 22, a random access memory (RAM) 23, a data buffer 24, and a device interface 25.

The host interface 20 is connected to the host device 3, and is a circuit that controls transfer of data, a command, and an address between the memory controller 2 and the host device 3.

The CPU 21 controls operations of the overall memory controller 2. The CPU 21, for example, issues a write command to the semiconductor storage device 1 in response to a write command received from the host device 3. In addition, the CPU 21 performs various processes for managing a memory space of the semiconductor storage device 1.

The ECC circuit 22 performs an error correction process for data. During a write operation, the ECC circuit 22 generates a parity based on write data received from the external host device, and assigns the generated parity to the write data. During a read operation, the ECC circuit 22 generates a syndrome based on read data received from the semiconductor storage device 1, and detects and corrects an error in the read data based on the generated syndrome.

The RAM 23 is a volatile memory such as a static random access memory (SRAM). The RAM 23 is used as a work area of the CPU 21 and stores, for example, firmware and various management tables for managing the semiconductor storage device 1.

The data buffer 24 temporarily stores data received from the external host device via the host interface 20. In addition, the data buffer 24 temporarily stores data received from the semiconductor storage device 1 via the device interface 25.

The device interface 25 is connected to the semiconductor storage device 1, and is a circuit that controls transfer of data, a command, and an address between the memory controller 2 and the semiconductor storage device 1.

[1-2] Configuration of Semiconductor Storage Device 1

Figure 2:
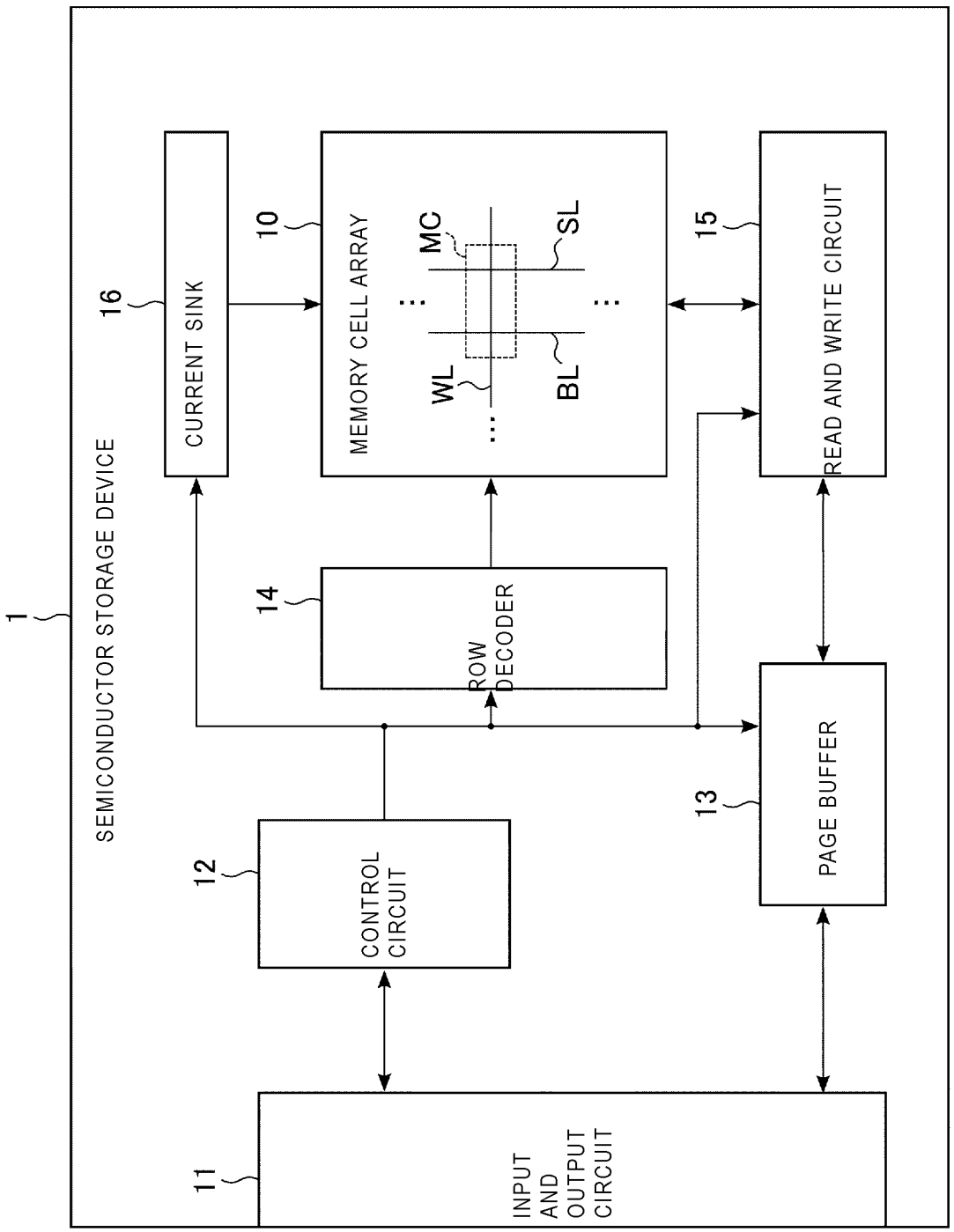
FIG. 2 is a block diagram showing a configuration example of the semiconductor storage device according to the embodiment.

FIG. 2 shows a configuration example of the semiconductor storage device 1 according to the embodiment. As shown in FIG. 2, the semiconductor storage device 1 includes a memory cell array 10, an input and output circuit 11, a control circuit 12, a page buffer 13, a row decoder 14, a read and write circuit 15, and a current sink 16.

The memory cell array 10 includes a plurality of memory cells MCs, a plurality of word lines WLs, a plurality of bit lines BLs, and a plurality of source lines SLs. Each of the plurality of bit lines BLs operates as a functional pair with a corresponding one of the plurality of source lines SLs. Each of the plurality of memory cells MCs is associated with a row and a column, and is connected to one word line WL and one set including a bit line BL and a source line SL. Each of the plurality of word lines is associated with a row. Each set including a bit line BL and a source line SL is associated with a column. The plurality of memory cells MCs in the same row are connected to the same word line WL. The plurality of memory cells MCs in the same column are connected to the same bit line BL and the same source line SL. A detailed configuration of the memory cell array 10 will be described later.

The input and output circuit 11 transmits various signals received from the memory controller 2 to the control circuit 12 and the page buffer 13. In addition, the input and output circuit 11 transmits various types of information received from the control circuit 12 and the page buffer 13 to the memory controller 2.

The control circuit 12 controls operations of the overall semiconductor storage device 1. Specifically, the control circuit 12 controls the page buffer 13, the row decoder 14, the read and write circuit 15, and the current sink 16. For example, the control circuit 12 performs the read operation, the write operation, and the like based on a command transferred from the input and output circuit 11.

The page buffer 13 temporarily stores data to be transmitted to and received from the memory controller 2 via the input and output circuit 11. Specifically, the page buffer 13 temporarily stores data received from the input and output circuit 11 and transmits the data to the read and write circuit 15. The page buffer 13 temporarily stores data received from the read and write circuit 15 and transmits the data to the input and output circuit 11.

The row decoder 14 controls a voltage of the word line WL. Specifically, the row decoder 14 selects the word line WL based on the control of the control circuit 12. Further, the row decoder 14 applies a voltage necessary for the operations such as a data write and read to the selected word line WL.

The read and write circuit 15 is connected to the plurality of bit lines BLs and the plurality of source lines SLs, and controls the data read from and data write to the memory cells. Details of the read and write circuit 15 will be described later.

The current sink 16 controls a connection between the source line SL and a ground line. For example, the current sink 16 sets the source line SL to a ground potential based on the control of the control circuit 12 when a sense amplifier SA reads data.

[1-3] Circuit Configuration of Memory Cell Array 10

Figure 3:
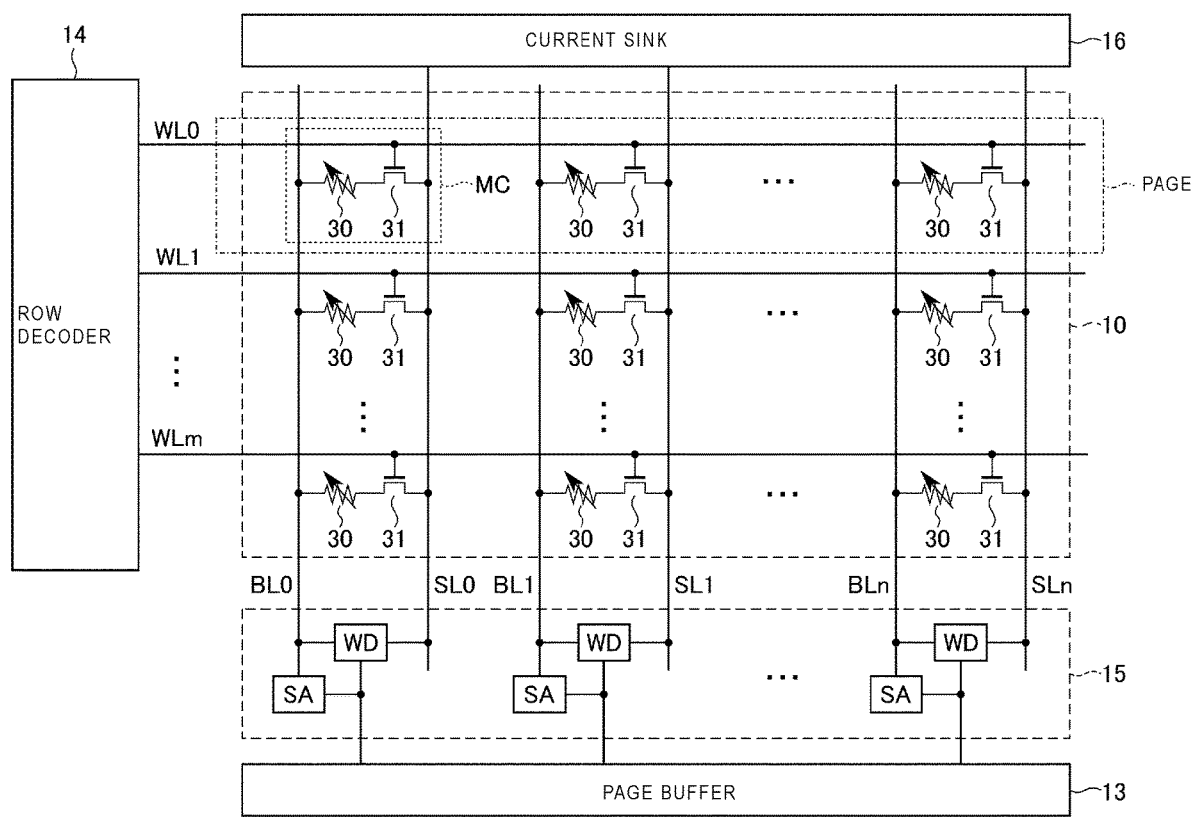
FIG. 3 is a circuit diagram showing an example of a circuit configuration of a memory cell array provided in the semiconductor storage device according to the embodiment.

FIG. 3 shows an example of a circuit configuration of the memory cell array 10 provided in the semiconductor storage device 1 according to the embodiment. As shown in FIG. 3, for example, the plurality of memory cells MCs are arranged in a matrix configuration in the memory cell array 10. Each of word lines WL0, WL1, WLm (m is a positive integer) is provided for a corresponding row of the memory cell array. A set including a bit line BL0 and a source line SL0, a set including a bit line BL1 and a source line SL1, . . ., and a set including a bit line BLn and a source line SLn (n is a positive integer) are each provided for one of the columns of the memory cell array.

Each memory cell MC includes a variable-resistance element 30 and a select transistor 31. The variable-resistance element 30 is, for example, the magnetoresistive effect element. The select transistor 31 electrically connects or disconnects the variable-resistance element 30 and the source line SL based on the voltage of the word line WL. One end of the variable-resistance element 30 is connected to the bit line BL. The other end of the variable-resistance element 30 is connected to one end of the select transistor 31. The other end of the select transistor 31 is connected to the source line SL. A gate of the select transistor 31 is connected to the word line WL.

The read and write circuit 15 includes a plurality of the sense amplifiers SAs and a plurality of write drivers WDs. Each sense amplifier SA includes a voltage holding unit capable of holding two types of voltages and an amplifier that amplifies a difference between the two types of the held voltages. The plurality of sense amplifiers SAs are each provided for one of the plurality of bit lines BLs. Each sense amplifier SA is connected to a corresponding bit line BL. The sense amplifier SA reads data stored in the memory cell MC by causing a read current to flow through the bit line BL and detecting a voltage of the bit line BL. The plurality of write drivers WDs are each provided for one of the plurality of sets of bit line BL and source line SL. Each write driver WD is connected to a corresponding set including a bit line BL and a source line SL. The write driver WD writes data in the memory cell MC by applying a potential difference between the bit line BL and the source line SL and causing a write current to flow through the memory cell MC.

In the specification, a set of memory cells MCs connected to a common word line WL is referred to as a page. Each of the plurality of memory cells MCs that make up the page stores 1-bit data. In addition, a set of multi-bit data stored by the plurality of memory cells MCs that make up the page is referred to as page data. For example, the page data corresponds to a unit of the data stored in the page buffer 13, a unit of data transmitted and received between the semiconductor storage device 1 and the memory controller 2, and a unit of data for which the error correction is performed by the ECC circuit 22.

The read and write circuit 15 can read data in units of a page by controlling the plurality of sense amplifiers SAs in parallel. Similarly, the read and write circuit 15 can write data in units of a page by controlling the plurality of write drivers WDs in parallel. In other words, the read and write circuit 15 can simultaneously read data from the plurality of memory cells MCs of a certain page. In addition, the read and write circuit 15 can simultaneously write data to the plurality of memory cells MCs of a certain page.

[1-4] Configuration of Memory Cell MC

Figure 4:
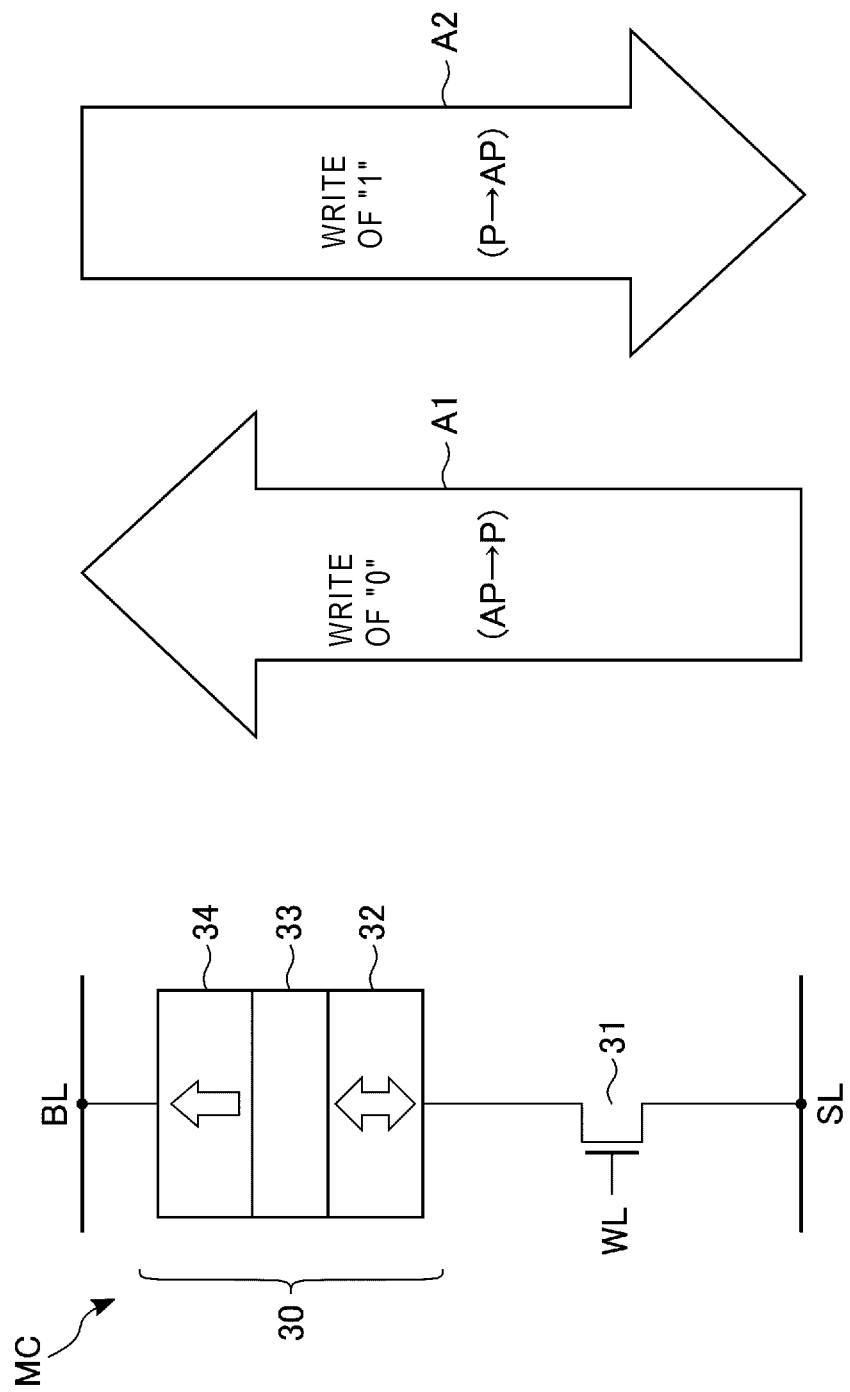
FIG. 4 is a schematic diagram showing a configuration of a memory cell provided in the semiconductor storage device according to the embodiment.

FIG. 4 is a schematic diagram showing a configuration of the memory cell MC provided in the semiconductor storage device 1 according to the embodiment. As shown in FIG. 4, the variable-resistance element 30 includes a storage layer 32, a tunnel barrier layer 33, and a reference layer 34. The storage layer 32, the tunnel barrier layer 33, and the reference layer 34 are stacked in this order, the source line SL is connected to a storage layer 32 side via the select transistor 31 and the bit line BL is connected to a reference layer 34 side.

In the variable-resistance element 30, respective magnetization orientations of the storage layer 32 and the reference layer 34 are perpendicular to respective film surfaces. That is, the variable-resistance element 30 in the present example is a perpendicular magnetization magnetoresistive effect element.

The storage layer 32 is a ferromagnetic layer having a magnetization easy axis direction in a direction perpendicular to the film surface, and includes, for example, cobalt iron boron (CoFeB) or iron boride (FeB). The magnetization orientation of the storage layer 32 is either a direction toward the tunnel barrier layer 33 or a direction away from the tunnel barrier layer 33. The magnetization orientation of the storage layer 32 is easily reversed as compared with the magnetization orientation of the reference layer 34. That is, the storage layer 32 has a magnetization reversal threshold value lower than that of the reference layer 34.

The tunnel barrier layer 33 is a nonmagnetic insulating film and includes, for example, magnesium oxide (MgO).

The reference layer 34 is a ferromagnetic layer having a magnetization easy axis direction in a direction perpendicular to the film surface, and includes, for example, cobalt platinum (CoPt), cobalt nickel (CoNi), or cobalt palladium (CoPd). The magnetization orientation of the reference layer 34 is fixed. In the example shown in FIG. 4, the magnetization orientation of the reference layer 34 is fixed in a direction toward the side opposite to the tunnel barrier layer 33. It should be noted that "the magnetization orientation is fixed" means that the magnetization orientation is not changed by a current with a magnitude that may reverse the magnetization orientation of the storage layer 32. The storage layer 32, the tunnel barrier layer 33, and the reference layer 34 form the magnetic tunnel junction.

In the embodiment, a spin injection write method is used in which a write current directly flows to the variable-resistance element 30 and the magnetization orientation of the storage layer 32 is controlled by the write current. The variable-resistance element 30 is in a low resistance state or a high resistance state depending on whether the magnetization orientation of the storage layer 32 and the magnetization orientation of the reference layer 34 are parallel or antiparallel.

In the variable-resistance element 30, when the write current flows in a direction of an arrow A1 in FIG. 4, that is, from the storage layer 32 to the reference layer 34, the magnetization orientations of the storage layer 32 and the reference layer 34 become parallel. In the parallel state, a resistance value of the variable-resistance element 30 is low, and the variable-resistance element 30 is set in the low resistance state. The low resistance state is called a "parallel (P) state" and for example, is defined as a state of data of "0".

In the variable-resistance element 30, when the write current flows in a direction of an arrow A2 in FIG. 4, that is, from the reference layer 34 to the storage layer 32, the magnetization orientations of the storage layer 32 and the reference layer 34 become antiparallel. In the antiparallel state, the resistance value of the variable-resistance element 30 is high, and the variable-resistance element 30 is set in the high resistance state. The high resistance state is called an "anti-parallel (AP) state" and for example, is defined as a state of data of "1".

As described above, the variable-resistance element 30 includes the low resistance state and the high resistance state, and transitions between the low resistance state and the high resistance state according to the direction in which the write current flows. That is, the variable-resistance element 30 functions as a memory element capable of storing the data in a nonvolatile manner by associating the low resistance state and the high resistance state with the data.

In the following description, the description will be made in accordance with the method for defining the data described above, but the method for defining the data of "1" and the data of "0" is not limited to the example described above. For example, the P state may be defined as the data of "1", and the AP state may be defined as the data of "0".

[2] Read Operation of Semiconductor Storage Device 1

Figure 5:
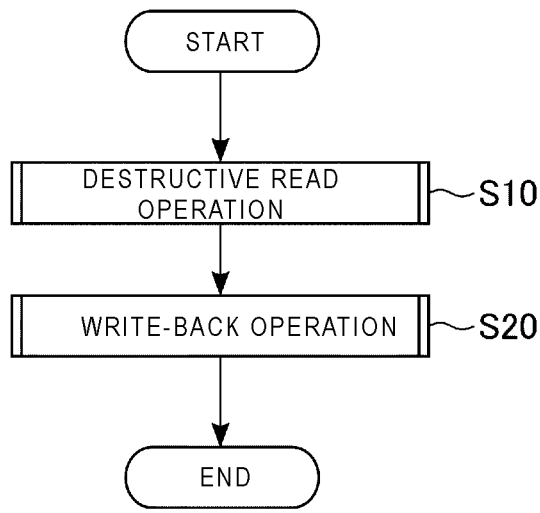
FIG. 5 is a flowchart showing a read operation of the semiconductor storage device according to the embodiment.

Next, the read operation of the semiconductor storage device 1 according to the embodiment will be described. FIG. 5 is a flowchart showing the read operation of the semiconductor storage device 1 according to the embodiment. As shown in FIG. 5, in the read operation, the semiconductor storage device 1 sequentially performs a destructive read operation (step S10) and a write-back operation (step S20).

The destructive read operation is a read operation involving a write operation. In the destructive read operation, the data stored in the memory cell MC is determined by comparing information read before the write with information read after the write. When the destructive read is performed, the data stored in the memory cell MC is overwritten.

The write-back operation is an operation of writing the data to the memory cell MC in which result data of the destructive read is overwritten. The data to be written to the memory cell MC is data determined as a result of the destructive read, or data obtained as a result of error correction.

The read operation in which the destructive read operation and the write-back operation described above are performed is also referred to as a self-referenced read operation. Details of the destructive read operation and the write-back operation will be described below.

(For Destructive Read Operation)

Figure 6:
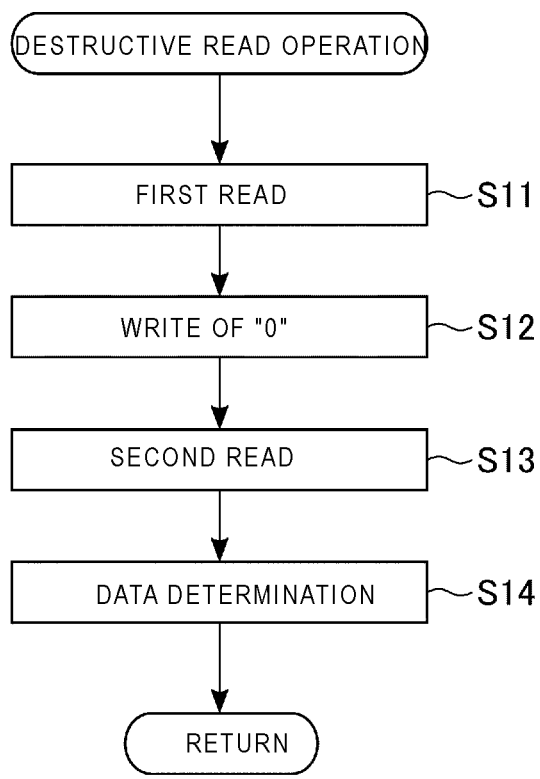
FIG. 6 is a flowchart showing a destructive read operation of the semiconductor storage device according to the embodiment.

First, the destructive read operation of the semiconductor storage device 1 will be described with reference to FIG. 6. FIG. 6 is a flowchart showing the destructive read operation.

First, the control circuit 12 controls the row decoder 14, the read and write circuit 15, the current sink 16, and the like to perform a first read (step S11). Specifically, the row decoder 14 selects one word line WL. The current sink 16 grounds the source lines SLs. Each sense amplifier SA in the read and write circuit 15 supplies a read current to a corresponding bit line BL. Further, each sense amplifier SA holds a voltage VBL1 based on the data stored in the selected memory cell MC, based on the voltage of the corresponding bit line BL.

Next, the control circuit 12 controls the read and write circuit 15, the current sink 16 and the like to write "0" (step S12). Specifically, the current sink 16 cuts off the connection between the source lines SLs and the ground potential. Each write driver WD in the read and write circuit 15 supplies a write current to a corresponding set including a bit line BL and a source line SL, and writes the data of "0" to each memory cell MC.

Next, the control circuit 12 controls the read and write circuit 15, the current sink 16 and the like to perform a second read (step S13). Specifically, the current sink 16 grounds the source lines SLs. Each sense amplifier SA in the read and write circuit 15 supplies a read current to a corresponding bit line BL. Further, each sense amplifier SA holds a voltage VBL2 based on the data stored in each selected memory cell MC.

Next, the control circuit 12 performs data determination by controlling each sense amplifier SA and the like (step S14). Specifically, each sense amplifier SA determines whether the data stored in each memory cell MC is "0" or "1" by comparing the voltage VBL1 and the voltage VBL2. The determined data is transmitted to the page buffer 13 and stored therein.

In the semiconductor storage device 1 in which the destructive read operation is completed, the page data stored by the memory cell MC connected to the selected word line WL is stored by the page buffer 13. The data of "0" is overwritten in each memory cell MC connected to the selected word line WL by the write of "0" in step S12.

When the destructive read operation is completed, the control circuit 12 transmits the read page data stored in the page buffer 13 to the memory controller 2 via the input and output circuit 11. When the memory controller 2 receives the read page data, the ECC circuit 22 starts the error correction process.

The page buffer 13 stores the read page data even after transmitting the read page data to the memory controller 2. Further, the control circuit 12 starts the write-back operation using the read page data. That is, in the read operation of the semiconductor storage device 1 according to the embodiment, the error correction process of the read data obtained by the destructive read operation and the write-back operation are performed in parallel.

(For Write-back Operation)

Figure 7:
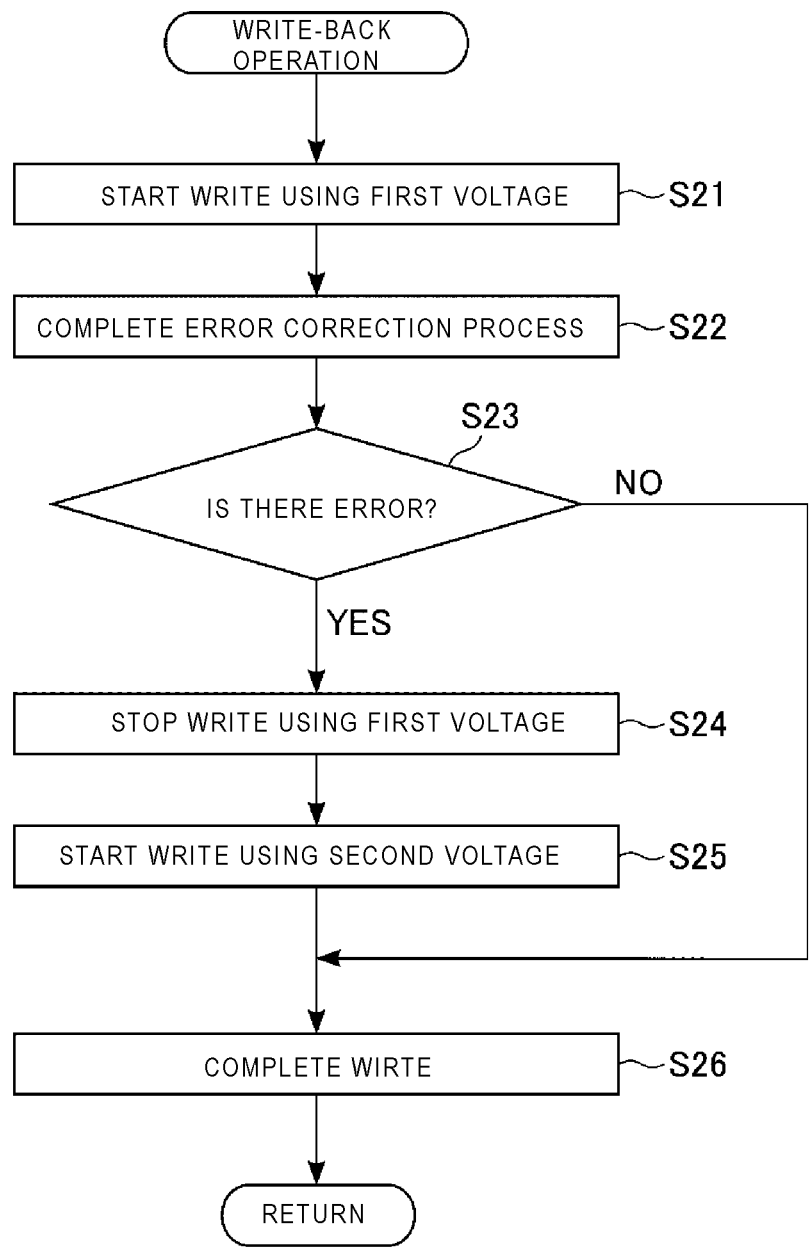
FIG. 7 is a flowchart showing a write-back operation of the semiconductor storage device according to the embodiment.

Next, the write-back operation of the semiconductor storage device 1 will be described with reference to FIG. 7. FIG. 7 is a flowchart showing the write-back operation, and is described focusing on the write-back operation for one memory cell MC among the memory cells MCs connected to the selected word line WL.

First, the control circuit 12 controls the write driver WD and the like to start a write using a first voltage (step S21). Specifically, the write driver WD writes the read data stored in the page buffer 13 to the memory cell MC. At this time, the write driver WD starts the write using the first voltage.

Then, in the middle of the write using the first voltage, the error correction process performed by the ECC circuit 22 is completed (step S22). The read data subjected to the error correction process is transmitted to the semiconductor storage device 1 and stored in the page buffer 13. Hereinafter, the read data subjected to the error correction is referred to as corrected data.

Next, the control circuit 12 determines the presence or absence of an error (step S23). Specifically, the control circuit 12 confirms whether there is a difference between the read data and the corrected data referring to the data stored in page buffer 13.

When the read data is different from the corrected data, that is, when there was an error in the read data (step S23, yes), the control circuit 12 stops the write using the first voltage (step S24). Further, the control circuit 12 causes the write driver WD to start a write using a second voltage based on the corrected data (step S25). Then, the write is continued until a determined operation timing to complete the write (step S26).

On the other hand, when the read data is the same as the corrected data, that is, when there was no error in the read data (step S23, no), the control circuit 12 continues the write using the first voltage started in step S21. Thereafter, the write is continued until the determined operation timing to complete the write (step S26).

In the write-back operation, the operation for the memory cell MC differs depending on the presence or absence of an error. However, the timing of completing the write-back operation is the same regardless of the presence or absence of an error. In other words, processing time from step S21 to step S26 is the same when there was an error and when there was no error in step S23.

When the write-back operation is completed, each memory cell MC connected to the selected word line WL is in a state where the read data or the corrected data was stored.

As described above, when the destructive read operation and the write-back operation are completed, the semiconductor storage device 1 completes the read operation.

Figure 8:
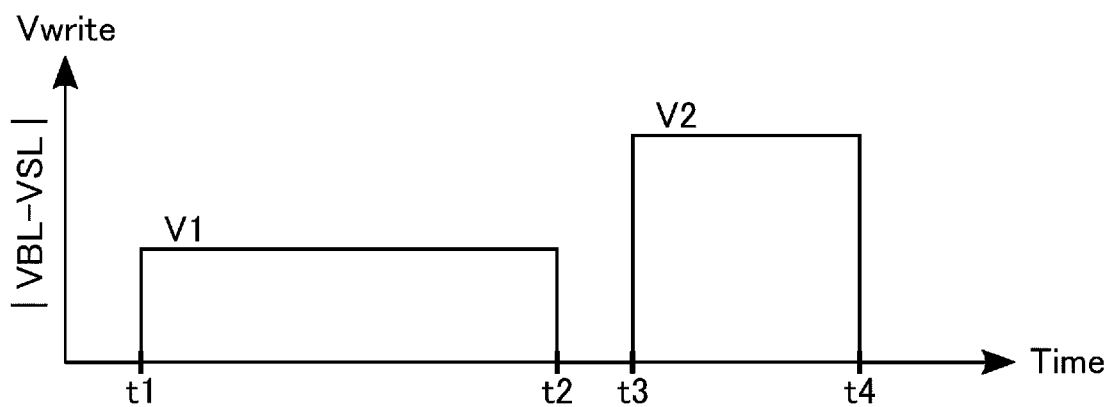
FIG. 8 is a timing chart showing a write-back operation when there is an error in the semiconductor storage device according to the embodiment.
Figure 9:
FIG. 9 is a timing chart showing a write-back operation when there is no error in the semiconductor storage device according to the embodiment.

Hereinafter, an example of a voltage applied to the memory cell MC in the write-back operation will be described with reference to FIGS. 8 and 9. FIG. 8 is a timing chart showing a magnitude of a voltage applied to the memory cell MC when there was an error in the write-back operation. FIG. 9 is a timing chart showing a magnitude of a voltage applied to the memory cell MC when there was no error in the write-back operation.

In FIGS. 8 and 9, a horizontal axis indicates the time, and a vertical axis indicates an absolute value of the difference between a bit line voltage VBL and a source line voltage VSL, that is, indicates a magnitude of a voltage Vwrite applied to the memory cell MC. In addition, time points t1 to t4 shown in FIG. 8 indicate the same time points as in FIG. 9, and a time between the time points t1 to t4 in FIG. 8 is the same as in FIG. 9. In addition, the time point t1 corresponds to a time point when the write at the first voltage is started in step S21 of FIG. 7. The time point t2 corresponds to a time point when the write at the first voltage is stopped in step S24 of FIG. 7. The time point t3 corresponds to a time point when the write at the second voltage is started in step S25 of FIG. 7. The time point t4 corresponds to a time point when the write is completed in step S26 of FIG. 7.

As shown in FIGS. 8 and 9, a first voltage V1 is applied to the memory cell MC at the time point t1. The first voltage V1 is continuously applied to the memory cell MC from the time point t1 to the time point t2.

As shown in FIG. 8, when there was an error in the data referred in the write using the first voltage V1, application of the first voltage V1 is stopped at the time point t2, and a second voltage V2 is applied to the memory cell MC at the time point t3. The second voltage V2 is a voltage higher than the first voltage V1. The second voltage V2 is continuously applied to the memory cell MC from the time point t3 to the time point t4.

On the other hand, as shown in FIG. 9, when there was no error in the data referred in the write using the first voltage V1, the first voltage V1 is continuously applied to the memory cell MC from the time point t2 to the time point t4. That is, when there was no error in the read data referred in the write using the first voltage V1, the first voltage V1 is continuously applied from the time point t1 to the time point t4.

It should be noted that the positive and negative of the voltage applied to the memory cell MC in the write-back operation described above changes depending on the data written to the selected memory cell MC. Therefore, in the write-back operation for the memory cell in which there was an error in the read data, the positive and negative of the voltage applied between the time point t1 and the time point t2 is different from that of the voltage applied between the time point t3 and the time point t4. In other words, the direction in which the voltage is applied is different depending on the data written to the selected memory cell MC.

[3] Effects of Embodiment

According to the semiconductor storage device 1 of the embodiment described above, a stress on the memory cell MC can be reduced and lifetime of the memory cell MC can be extended. Hereinafter, details of the effects of the semiconductor storage device 1 according to the first embodiment will be described.

As the semiconductor storage device using the variable-resistance element, a magnetoresistive random access memory (MRAM) using a magnetoresistive element is known. A feature of the memory cell using the variable-resistance element is that a change of the resistance value is used for storing the data. For example, in a read operation of the MRAM, the read current flows through the variable-resistance element. Further, a current value or a voltage value based on the resistance value of the variable-resistance element is obtained and compared with a reference threshold value to determine the resistance state.

However, when a resistance value fluctuation in the variable-resistance element increases, an interval between the two resistance value distributions of the high resistance state and the low resistance state is narrowed. Therefore, when a common reference threshold value is set for the high resistance state and the low resistance state in the read operation, a read margin may be reduced.

In contrast, the self-referenced read operation based on a resistance state of one of among the high resistance state and the low resistance state of the variable-resistance element is known. The self-referenced read operation includes a first read, a specific data write, and a second read. In the self-referenced read operation, for example, specific data is written after the first read, and then the second read is performed. Further, the data is determined by comparing a first read result with a signal with an offset added to a second read result.

That is, in the self-referenced read operation, the signal with the offset added to the second read result is used as a reference signal, and the reference signal is set for each memory cell. Therefore, erroneous read caused by characteristic fluctuation of the memory cell can be prevented. On the other hand, since the self-referenced read operation is the destructive read operation accompanied by the write to the memory cell, it is necessary to write the read data to the memory cell again.

For example, in the write-back operation, the semiconductor storage device first starts a write using the read data of the destructive read operation, and the error correction process is performed in parallel with the write. Further, when the error correction process is completed, the semiconductor storage device writes the corrected data to a memory cell corresponding to an error bit. The processing time of the write-back operation of the semiconductor storage device is set to a time from the start of the write using the read data of the destructive read operation to the completion of the write when the error bit was detected.

In addition, in the variable-resistance element used as the memory cell, a write error rate changes according to the magnitude and application time of a write voltage. Specifically, when the write voltage is large, the write error rate decreases. When the write voltage is small, the write error rate increases. In addition, when the time for applying the write voltage is long, the write error rate decreases. When the time for applying the write voltage is short, the write error rate increases. Based on these relationships, when the time for applying the write voltage is lengthened, the write voltage can be lowered while maintaining a constant write error rate. In other words, the write can be performed with a low stress while maintaining the constant error rate by lowering the write voltage and lengthening the time for applying the voltage.

Figure 10:
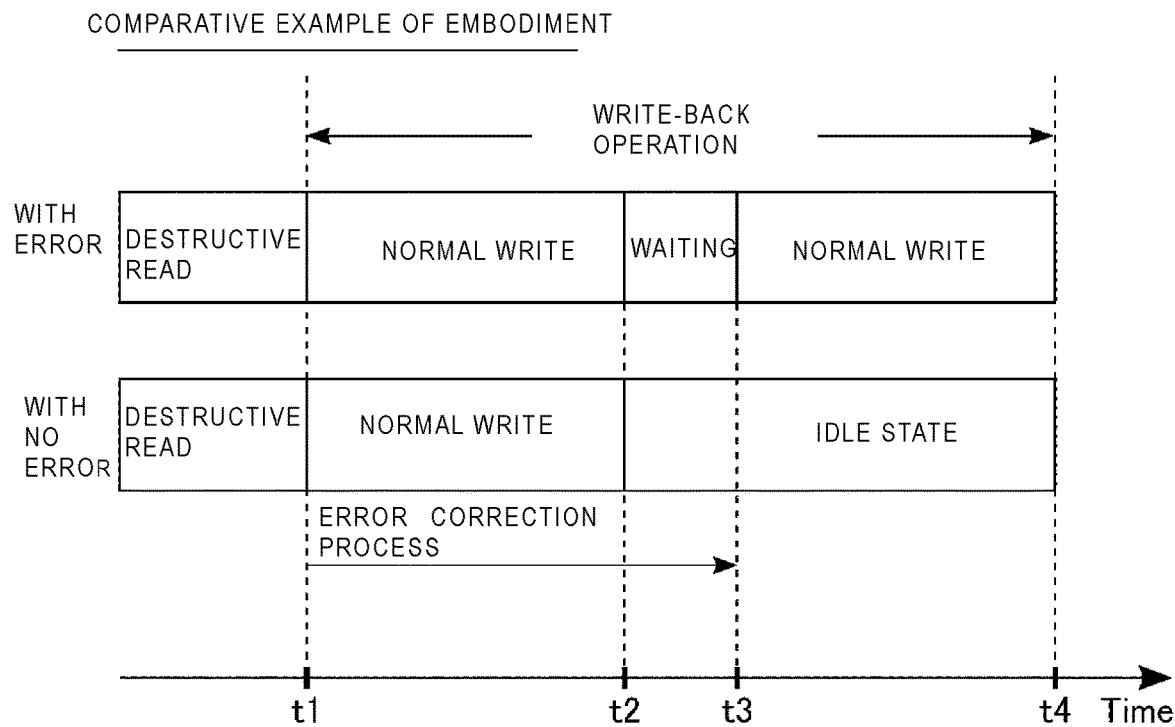
FIG. 10 is a timing chart showing a read operation of a semiconductor storage device according to a comparative example of the embodiment.

FIG. 10 is a timing chart showing a read operation of a semiconductor storage device according to a comparative example of the embodiment. A period from a time point t1 to a time point t2 and a period from a time point t3 to a time point t4 in FIG. 10 respectively correspond to, for example, the same lengths as the period from the time point t1 to the time point t2 and the period from the time point t3 to the time point t4 in FIGS. 8 and 9. In the drawings referred to below, "with error" corresponds to an operation corresponding to a memory cell in which an error was detected by the error correction process, and "with no error" corresponds to an operation corresponding to a memory cell in which no error was detected by the error correction process.

As shown in FIG. 10, in the semiconductor storage device according to the comparative example of the embodiment, when the write of the corrected data is being performed, the memory cell in which correct data is read by the destructive read operation and the write of the data is completed is in a waiting state (idle state).

In addition, the read operation in the comparative example is different from the read operation in the embodiment in that the write performed in the write-back operation is one type of normal write. A magnitude of a voltage used in the normal write is similar with the write voltage used in the write operation of the semiconductor storage device, and corresponds to, for example, the second voltage in the embodiment.

In contrast, in the write-back operation, the semiconductor storage device 1 according to the embodiment performs the write, in which the read data of the destructive read operation was used, at a voltage lower than the normal write, and performs a write at a voltage similar with the normal write when an error was detected.

Figure 11:
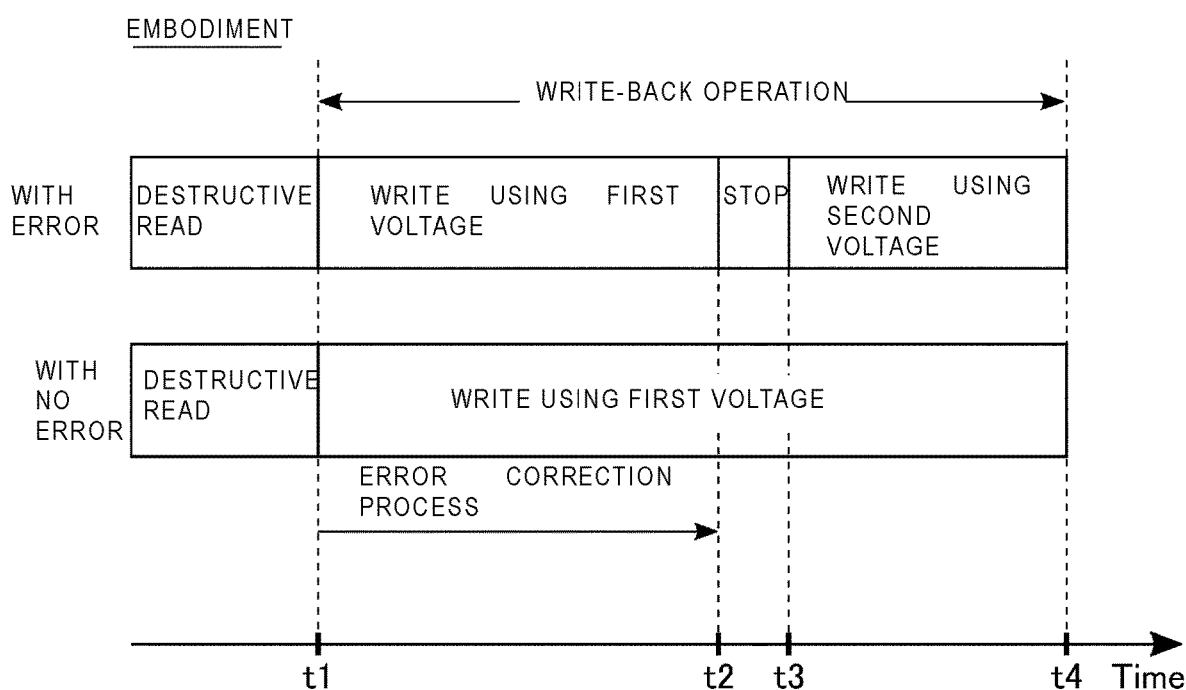
FIG. 11 is a timing chart showing the read operation of the semiconductor storage device according to the embodiment.

FIG. 11 is a timing chart showing the read operation of the semiconductor storage device 1 according to the embodiment. Time points t1 to t4 in FIG. 11 correspond to the time points t1 to t4 in FIGS. 8 and 9, respectively.

As shown in FIG. 11, the semiconductor storage device 1 according to the embodiment starts the write in which the read data of the destructive read operation was used, using the first voltage with a stress lower than the normal write. Then, when the error correction process for the read data is completed, the write using the first voltage is continued in the memory cell with no error, and the write using the first voltage is shifted to the write using the second voltage in the memory cell with an error.

The write using the first voltage uses a voltage lower than the normal write, but the write error rate can be lowered, or the write can be performed with a low stress while maintaining the write error rate by applying the first voltage to the memory cell from the time point t1 to the time point t4. The write using the second voltage can be completed in a shorter time than the write using the first voltage by using the similar voltage as the normal write.

In addition, in the memory cell "with error" in the embodiment, since the write with a low stress using the first voltage is performed from the time point t1 to the time point t2, the stress in the write-back operation is smaller than that in the comparative example. Similarly, in the memory cell "with no error" in the embodiment, since the write using the first voltage is performed from the time point t1 to the time point t4, the stress in the write-back operation is smaller than that in the comparative example.

As described above, the semiconductor storage device 1 according to the embodiment can perform the write-back operation with the low stress without delaying the entire operation. In other words, the semiconductor storage device 1 according to the embodiment can reduce the stress on the memory cell MC and can extend lifetime of the memory cell MC without delaying the operation. That is, the reliability of the memory cell can be increased.

[4] Other Modifications

In the embodiment, a case is shown in which the memory cell MC includes the select transistor 31 that is a three-terminal element, but the present disclosure is not limited thereto. For example, the memory cell MC may be configured with the variable-resistance element and a two-terminal switching element. For example, the two-terminal switching element is in a high resistance state when a voltage applied between the two terminals is less than a threshold value, and electrically disconnects the two terminals. In addition, the two-terminal switching element is in a low resistance state when the voltage applied between the two terminals is equal to or greater than the threshold value, and electrically connects the two terminals. The two-terminal switching element has the function regardless of the direction of the voltage applied between the two terminals. That is, the memory cell including the variable-resistance element and the two-terminal switching element has a function capable of switching between flowing and cutting off of the current depending on the magnitude of the voltage applied to the memory cell.

In the storage layer 32, tunnel barrier layer 33, and reference layer 34 provided in the variable-resistance element 30, the film surface is a surface perpendicular to a stacking direction and is also a boundary surface between adjacent layers. That is, the direction perpendicular to the film surface is equivalent to the stacking direction. The respective film surfaces of the storage layer 32, the tunnel barrier layer 33, and the reference layer 34 are parallel one another.

In the embodiment, any data may be used as the data used in the write performed in the destructive read operation.

Therefore, in the embodiment, a case is shown in which the "0" is written in the destructive read operation, but the "1" may be written.

In the embodiment, an example is given in which the memory controller 2 includes the ECC circuit 22 and the error correction process is performed by the memory controller 2, but the scope of the present disclosure is not limited thereto. For example, the semiconductor storage device 1 may include the ECC circuit, and the error correction process may be performed in the semiconductor storage device 1. In such a case, the semiconductor storage device 1 can also perform the write-back operation similar as that of the embodiment.

In addition, in the embodiment, the data corrected by the ECC circuit 22 is transmitted from the memory controller 2 to the semiconductor storage device 1 and stored in the page buffer 13. Further, the control circuit 12 compares the read data stored in the page buffer 13 with the corrected data to determine the presence or absence of an error. An exchange regarding the error correction between the memory controller 2 and the semiconductor storage device 1 is not limited to the above. For example, the ECC circuit 22 may compare the read data with the corrected data to determine the presence or absence of an error. Further, the ECC circuit 22 may transmit data specifying a bit in which the error occurs to the semiconductor storage device 1.

In this specification, applying the voltage to the memory cell MC and performing the write using a certain voltage in the memory cell MC mean applying a potential difference between one end and the other end of the memory cell MC by controlling the voltage of the bit line BL and the voltage of the source line SL, respectively. The voltage of the bit line BL may be higher than the voltage of the source line SL, or the voltage of the source line SL may be higher than the voltage of the bit line BL.

In addition, in the specification, the magnitude, rising-dropping, and a high-low level of the voltage used for the write indicate a magnitude relationship of the absolute value of the voltage. For example, the second voltage V2 being greater than the first voltage V1 indicates that the absolute value of the second voltage V2 is greater than the absolute value of the first voltage V1. Lowering the write voltage indicates decreasing the absolute value of the write voltage. In addition, the low voltage indicates a voltage with a small absolute value.

In the embodiment, a configuration is shown in which one end of the memory cell MC is connected to the bit line BL and the other end is connected to the source line SL, but the wiring name is not limited thereto. For example, the bit line BL may be replaced with a first bit line, and the source line SL may be replaced with a second bit line.

In the embodiment, a case is described in which the second voltage V2 is a voltage larger than the first voltage V1, and the write using the first voltage V1 is performed in the low stress. The magnitude relationship between the first voltage V1 and the second voltage V2 is not limited to the above. For example, the first voltage V1 may be a voltage with the same magnitude as the second voltage V2. As each of the first voltage V1 and the second voltage V2, any voltage can be used depending on the write error rate allowed in the semiconductor storage device 1.

In the embodiment, a case is described in which the write using the first voltage when there was no error and the write using the second voltage when there was an error are completed at the same timing in the write-back operation. However, the timing at which the write using the first voltage when there was no error is completed is not limited to the above. For example, in the write-back operation when there was no error, the time during which the first voltage is applied may be longer than the time during which the first voltage is applied when there was an error and longer than the time during which the second voltage is applied when there was an error. In this case, the memory cell may be set to the idle state during a time from the completion of the application of the first voltage to the completion of the write-back operation. Even in such a case, the semiconductor storage device 1 can also improve the reliability of the memory cell.

While certain embodiments have been described, these embodiments have been presented by way of example only, and are not intended to limit the scope of the inventions. These novel embodiments can be implemented in various other forms and various omissions, substitutions and changes can be made without departing from the spirit of the present disclosure. These embodiments and modifications thereof are included in the scope and gist of the present disclosure and are included in the present disclosure described in the claims and the equivalent scope thereof.

What is claimed is:

1. A semiconductor storage device comprising:
   first and second memory cells each including a variable-resistance element;
   a write driver configured to apply a voltage to each of the first and second memory cells; and
   a control circuit configured to concurrently perform an operation to read first data in the first memory cell and second data in the second memory cell, the operation to read the first data in the first memory cell including a first write operation for a first time length and the operation to read the second data in the second memory cell including a second write operation for a second time length, wherein
   in the first write operation, the write driver applies, to the first memory cell, a first voltage for a third time length and a second voltage different from the first voltage for a fourth time length, and
   in the second write operation, the write driver applies the first voltage to the second memory cell for a fifth time length longer than the third time length and longer than the fourth time length.

2. The semiconductor storage device according to claim 1, wherein the first time length is equal to the second time length.

3. The semiconductor storage device according to claim 1, further comprising:
   a sense amplifier connected to the first memory cell, wherein
   the operation to read the first data stored in the first memory cell includes a first read operation, a third write operation, and a second read operation, which are carried out sequentially in that order,
   in the first read operation, the sense amplifier obtains a third voltage based on the first data stored in the first memory cell,
   in the third write operation, the write driver writes third data to the first memory cell,
   in the second read operation, the sense amplifier obtains a fourth voltage based on the third data written to the first memory cell, and
   after the second read operation, the control circuit determines the first data based on the third voltage and the fourth voltage, and performs the first write operation using the determined first data.

4. The semiconductor storage device according to claim 3, wherein
   in the operation to read the first data stored in the first memory cell, an error correction process is performed on the determined first data, and
   after the second read operation, the control circuit performs the first write operation upon determining that there is an error in the determined first data.

5. The semiconductor storage device according to claim 4, wherein
   in the first write operation, the write driver applies the second voltage after applying the first voltage, wherein the first voltage is applied to write the determined first data, and the second voltage is applied to write data obtained by correcting the determined first data.

6. The semiconductor storage device according to claim 1, further comprising:
   a sense amplifier connected to the second memory cell, wherein
   the operation to read the second data stored in the second memory cell includes a first read operation, a third write operation, and a second read operation, which are carried out sequentially in that order,
   in the first read operation, the sense amplifier obtains a third voltage based on the second data stored in the second memory cell,
   in the third write operation, the write driver writes third data to the second memory cell,
   in the second read operation, the sense amplifier obtains a fourth voltage based on the third data written to the second memory cell, and
   after the second read operation, the control circuit determines the second data based on the third voltage and the fourth voltage, and performs the second write operation using the determined second data.

7. The semiconductor storage device according to claim 6, wherein
   in the operation to read the second data stored in the second memory cell, an error correction process is performed on the determined second data, and
   after the second read operation, the control circuit continues performing the second write operation using the determined second data upon determining that there is no error in the determined second data.

8. The semiconductor storage device according to claim 6, wherein
   in the second write operation, the write driver applies the first voltage to write the determined second data.

9. The semiconductor storage device according to claim 1, wherein
   an absolute value of the first voltage is smaller than an absolute value of the second voltage.

10. The semiconductor storage device according to claim 1, wherein
    in the first write operation, a direction in which the first voltage is applied to the first memory cell is different from a direction in which the second voltage is applied to the first memory cell.

11. The semiconductor storage device according to claim 1, further comprising:
    a first bit line connected to one end of the first memory cell; and
    a second bit line connected to the other end of the first memory cell, wherein
    the write driver applies a voltage to the first bit line and a voltage to the second bit line, so that a voltage applied to the first memory cell is equal to a voltage difference between the voltage applied to the first bit line and the voltage applied to the second bit line.

12. The semiconductor storage device according to claim 1, wherein
the fifth time length is longer than a sum of the third time length and the fourth time length.

13. A method of performing an operation to read first data in a first memory cell of a semiconductor storage device and second data in a second memory cell of the semiconductor storage device, the first and second memory cells each including a variable-resistance element, said method comprising:
concurrently performing the operation to read the first data in the first memory cell and the second data in the second memory cell, the operation to read the first data in the first memory cell including a first write operation for a first time length and the operation to read the second data in the second memory cell including a second write operation for a second time length, wherein
in the first write operation, a first voltage is applied to the first memory cell for a third time length and a second voltage different from the first voltage is applied to the first memory cell for a fourth time length, and
in the second write operation, the first voltage is applied to the second memory cell for a fifth time length longer than the third time length and longer than the fourth time length.

14. The method according to claim 13, wherein the first time length is equal to the second time length.

15. The method according to claim 13, wherein
the operation to read the first data stored in the first memory cell includes a first read operation, a third write operation, and a second read operation, which are carried out sequentially in that order,
in the first read operation, a sense amplifier obtains a third voltage based on the first data stored in the first memory cell,
in the third write operation, a write driver writes third data to the first memory cell,
in the second read operation, the sense amplifier obtains a fourth voltage based on the third data written to the first memory cell, and
after the second read operation, the control circuit determines the first data based on the third voltage and the fourth voltage, and performs the first write operation using the determined first data.

16. The method according to claim 15, further comprising:
performing an error correction process on the determined first data; and
after the second read operation, performing the first write operation upon determining that there is an error in the determined first data.

17. The method according to claim 13, wherein
the operation to read the second data stored in the second memory cell includes a first read operation, a third write operation, and a second read operation, which are carried out sequentially in that order,
in the first read operation, a sense amplifier obtains a third voltage based on the second data stored in the second memory cell,
in the third write operation, a write driver writes third data to the second memory cell,
in the second read operation, the sense amplifier obtains a fourth voltage based on the third data written to the second memory cell, and
after the second read operation, the control circuit determines the second data based on the third voltage and the fourth voltage, and performs the second write operation using the determined second data.

18. The method according to claim 17, further comprising:
performing an error correction process on the determined second data; and
after the second read operation, continuing to perform the second write operation using the determined second data upon determining that there is no error in the determined second data.

19. The method according to claim 13, wherein
in the first write operation, a direction in which the first voltage is applied to the first memory cell is different from a direction in which the second voltage is applied to the first memory cell.

20. The method according to claim 13, wherein
the fifth time length is longer than a sum of the third time length and the fourth time length.

* * * * *